United States Patent
Mantani et al.

(10) Patent No.: US 9,649,836 B2
(45) Date of Patent: May 16, 2017

(54) SCREEN PRINTING SYSTEM, SCREEN PRINTING APPARATUS AND COMPONENT MOUNTING LINE

(71) Applicant: PANASONIC INTELLECTUAL PROPERTY MANAGEMENT CO., LTD., Osaka (JP)

(72) Inventors: Masayuki Mantani, Yamanashi (JP); Nobuo Komiya, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/661,366

(22) Filed: Mar. 18, 2015

(65) Prior Publication Data

US 2015/0266286 A1 Sep. 24, 2015

(30) Foreign Application Priority Data

Mar. 18, 2014 (JP) .................................. 2014-054645

(51) Int. Cl.
| | |
|---|---|
| *B41F 15/18* | (2006.01) |
| *B41F 15/08* | (2006.01) |
| *B41F 15/26* | (2006.01) |
| *B23K 37/04* | (2006.01) |
| *H05K 3/12* | (2006.01) |

(52) U.S. Cl.
CPC .............. *B41F 15/08* (2013.01); *B41F 15/26* (2013.01); *B23K 37/04* (2013.01); *B41F 15/18* (2013.01); *B41P 2215/114* (2013.01); *H05K 3/1233* (2013.01); *H05K 2203/0139* (2013.01)

(58) Field of Classification Search
None
See application file for complete search history.

(56) References Cited

U.S. PATENT DOCUMENTS

| 4,305,331 A | * | 12/1981 | Colapinto | ............... B41F 15/22 101/123 |
|---|---|---|---|---|
| 5,436,028 A | * | 7/1995 | Becher | ................. H05K 3/1216 427/282 |
| 5,873,939 A | * | 2/1999 | Doyle | .................. H05K 3/1216 101/123 |
| 8,196,287 B2 | * | 6/2012 | Awata | ................ H05K 13/0061 198/465.1 |

(Continued)

FOREIGN PATENT DOCUMENTS

| JP | 2003-179390 A | 6/2003 |
|---|---|---|
| JP | 2008-272964 A | 11/2008 |
| JP | 2011-143640 A | 7/2011 |

*Primary Examiner* — Jill Culler
(74) *Attorney, Agent, or Firm* — Pearne & Gordon, LLP

(57) ABSTRACT

A screen printing system includes a first substrate supply apparatus, a second substrate supply apparatus arranged in an upstream process side of the first substrate supply apparatus, and a screen printing apparatus that prints paste on a first substrate supplied from the first substrate supply apparatus and a second substrate supplied from the second substrate supply apparatus. In response to a request from the screen printing apparatus, the first substrate supply part supplies the first substrate and the second substrate supply part supplies the second substrate. The second substrate is carried in the screen printing apparatus by a conveyance mechanism included in the first substrate supply apparatus.

3 Claims, 15 Drawing Sheets

(56) References Cited

U.S. PATENT DOCUMENTS

| | | | | |
|---|---|---|---|---|
| 8,327,761 | B2* | 12/2012 | Miyahara | B41F 15/0818 101/114 |
| 8,402,639 | B2* | 3/2013 | Nagao | H05K 13/0452 29/740 |
| 8,434,665 | B2* | 5/2013 | Motomura | H05K 3/363 228/178 |
| 2011/0197775 | A1* | 8/2011 | Nagao | H05K 13/0452 101/126 |
| 2012/0014084 | A1* | 1/2012 | Motomura | B23K 3/0638 361/807 |
| 2012/0085254 | A1* | 4/2012 | Nagao | B41F 15/08 101/126 |
| 2014/0083359 | A1* | 3/2014 | Miyake | B41F 15/08 118/697 |

* cited by examiner

SCREEN PRINTING SYSTEM, SCREEN PRINTING APPARATUS AND COMPONENT MOUNTING LINE

CROSS REFERENCE TO RELATED APPLICATION(S)

The present disclosure relates to the subject matters contained in Japanese Patent Application No. 2014-054645 filed on Mar. 18, 2014, which are incorporated herein by reference in its entirety.

FIELD

One or more embodiments of the present invention relate to a screen printing system for printing paste on a substrate, a screen printing apparatus and a component mounting line.

BACKGROUND

A known mounting line for manufacturing plural kinds of mounting substrates in parallel is a mounting line including two substrate supply apparatuses which are parallelly arranged in a direction orthogonal to a conveyance direction of the substrate and supply mutually different kinds of substrates, a screen printing apparatus for receiving two kinds of substrates supplied from these two substrate supply apparatuses and performing screen printing on the substrates one by one, and a component mounting apparatus for receiving the substrate carried out by the screen printing apparatus in one substrate conveyance lane and mounting components in the substrate as disclosed in JP-A-2011-143640, for instance.

SUMMARY

However, the component mounting line described above may have a problem of upsizing the screen printing apparatus for receiving substrates from the parallelly arranged plural substrate supply apparatuses when the plural substrate supply apparatuses are parallelly arranged in the direction orthogonal to the conveyance direction of the substrate in order to supply plural kinds of substrates to the screen printing apparatus in parallel.

Hence, one of objects of the embodiments of the invention is to provide a screen printing system, a screen printing apparatus and a component mounting line capable of performing screen printing on plural kinds of substrates in parallel without upsizing the screen printing apparatus.

According to the embodiments, there is provided a screen printing system according to the embodiments includes: a first substrate supply apparatus that supplies a first substrate and includes a conveyance mechanism; a second substrate supply apparatus that is arranged in an upstream process side of the first substrate supply apparatus and supplies a second substrate; and a screen printing apparatus that prints paste on the first substrate supplied from the first substrate supply apparatus and the second substrate supplied from the second substrate supply apparatus, wherein the screen printing apparatus includes: a mask in which a first pattern forming region in which a first pattern corresponding to the first substrate is formed and a second pattern forming region in which a second pattern corresponding to the second substrate is formed are arranged in a predetermined direction; a substrate holding part that holds a substrate of the first substrate or the second substrate; a substrate holding movement mechanism that is formed movably under the mask in the predetermined direction, moves the substrate held by the substrate holding part, and selectively brings the substrate into contact with one of the first pattern forming region and the second pattern forming region; a print head that prints paste on the substrate brought into contact with the selected pattern forming region; a substrate request part that requests supply of the first substrate from the first substrate supply apparatus and requests supply of the second substrate from the second substrate supply apparatus, wherein the first substrate supply part supplies the first substrate in response to the request from the substrate request part and the second substrate supply part supplies the second substrate in response to the request from the substrate request part, and the second substrate supplied by the second substrate supply apparatus is carried in the screen printing apparatus by the conveyance mechanism included in the first substrate supply apparatus.

According to the embodiments, there is provided a screen printing apparatus that prints paste on a first substrate supplied from a first substrate supply apparatus that includes a conveyance mechanism and a second substrate supplied from a second substrate supply apparatus arranged in an upstream process side of the first substrate supply apparatus, the screen printing apparatus including: a mask in which a first pattern forming region in which a first pattern corresponding to the first substrate is formed and a second pattern forming region in which a second pattern corresponding to the second substrate is formed are arranged in a predetermined direction; a substrate holding part that holds a substrate of the first substrate or the second substrate; a substrate holding movement mechanism that is formed movably under the mask in the predetermined direction, moves the substrate held by the substrate holding part, and selectively brings the substrate into contact with one of the first pattern forming region and the second pattern forming region; a print head that prints paste on the substrate brought into contact with the selected pattern forming region; a substrate request part that requests supply of the first substrate from the first substrate supply apparatus and requests supply of the second substrate from the second substrate supply apparatus, wherein the substrate request part sends a substrate request signal to the second substrate supply apparatus and also sends a pass signal to the first substrate supply apparatus, the pass signal commanding the first substrate supply apparatus to drive the conveyance mechanism included by the first substrate supply apparatus to convey the second substrate supplied by the second substrate supply apparatus.

According to the embodiments, there is provided a component mounting line including the above-described screen printing system; and a component mounting apparatus that mounts a component on the screen-printed substrate carried out by the screen printing apparatus.

According to the embodiments, screen printing can be performed on plural kinds of substrates in parallel without upsizing the screen printing apparatus.

BRIEF DESCRIPTION OF THE DRAWINGS

A general configuration that implements the various features of the invention will be described with reference to the drawings. The drawings and the associated descriptions are provided to illustrate embodiments of the invention and should not limit the scope of the invention.

DETAILED DESCRIPTION OF THE EXEMPLARY EMBODIMENTS

Figure 1:
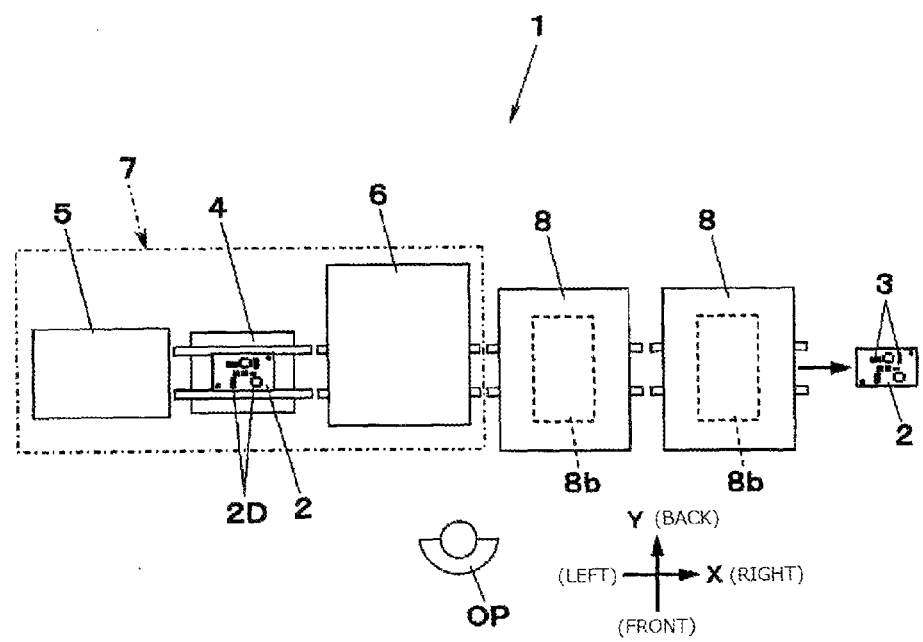
FIG. 1 is a plan view of a component mounting line in an embodiment of the invention.

An embodiment of the invention will hereinafter be described with reference to the drawings. FIG. 1 shows a component mounting line 1 in the embodiment of the invention. The component mounting line 1 is a line for manufacturing a mounting substrate (the so-called double-sided substrate herein) by attaching an electronic component 3 to each electrode 2D formed on each of the top and bottom of a substrate 2, and is configured to include a screen printing system 7 having a first substrate supply apparatus 4, a second substrate supply apparatus 5 and a screen printing apparatus 6 for performing screen printing on the substrate 2 supplied from the first substrate supply apparatus 4 and the second substrate supply apparatus 5, and plural component mounting apparatuses 8 installed in the downstream process side of the screen printing system 7. In the present embodiment, a left-right direction of the component mounting line 1 viewed from an operator OP is set as an X-axis direction and a front-back direction of the component mounting line 1 viewed from the operator OP is set as a Y-axis direction for convenience of description. Also, a vertical direction is set as a Z-axis direction. The substrate 2 travels from the left to the right in the case of viewing the component mounting line 1 from the operator OP in the X-axis direction. That is, the left side of paper of FIG. 1 is the upstream process side viewed from the operator OP.

The first substrate supply apparatus 4 stocks the substrates 2 in which paste Pst such as solder is not printed on both of the top and bottom surfaces in a directly stacked state, and supplies the substrate (called a "first substrate 2a") in which one surface of the substrate faces upwardly. The second substrate supply apparatus 5 stocks the substrates 2, in which paste Pst is printed on electrodes 2D of one surface and the electronic components 3 are attached to the electrodes 2D, supplied by the first substrate supply apparatus 4 in a state (a stepwise stacked state) housed in a magazine so that these substrates 2 do not make surface contact directly, and supplies the substrate (called a "second substrate 2b") in which the other surface where printing of the paste Pst and attachment of the electronic components 3 are not yet performed faces upwardly.

Figure 2:
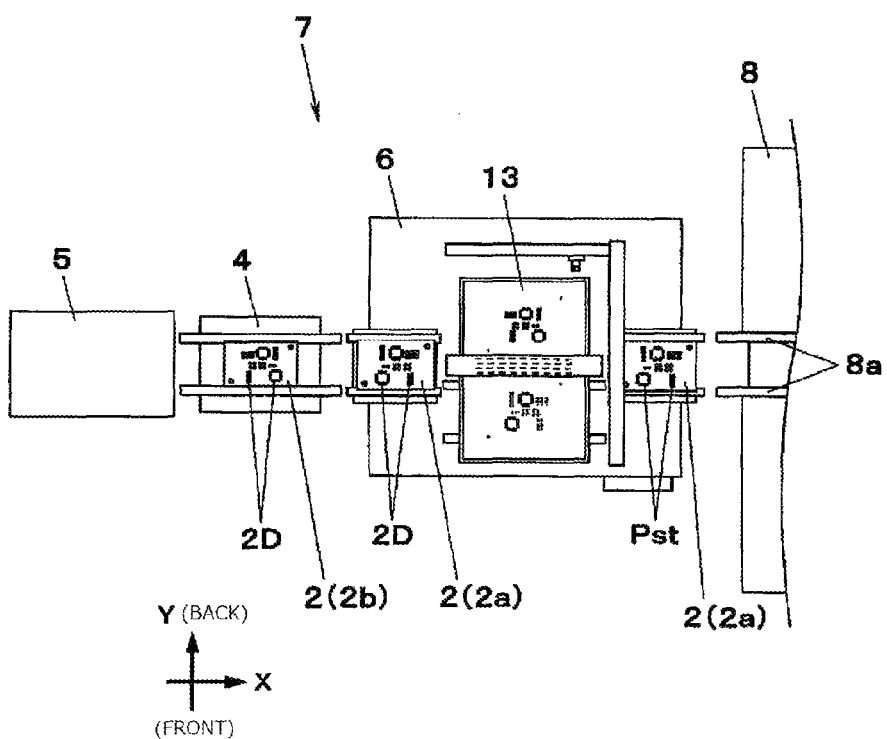
FIG. 2 is a plan view of a screen printing system in the embodiment of the invention.

In FIGS. 1 and 2, the first substrate supply apparatus 4 is arranged in a position proximate to the upstream process side of the screen printing apparatus 6, and the second substrate supply apparatus 5 is arranged in a position proximate to the upstream process side of the first substrate supply apparatus 4. That is, the screen printing system 7 is configured to arrange the second substrate supply apparatus 5, the first substrate supply apparatus 4 and the screen printing apparatus 6 in series in this order from the upstream process side. The first substrate supply apparatus 4 supplies the first substrate 2a based on a request from the screen printing apparatus 6, and the second substrate supply apparatus 5 supplies the second substrate 2b based on a request from the screen printing apparatus 6 (the details are described below).

Figure 3:
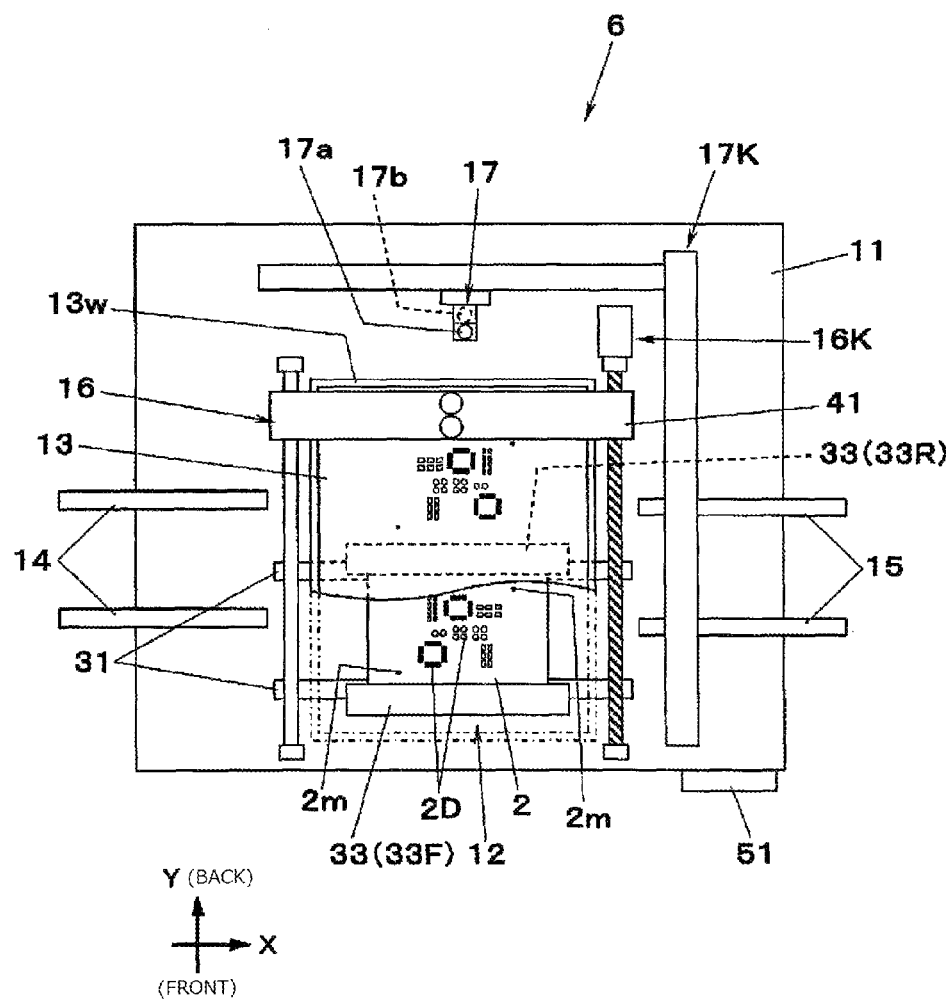
FIG. 3 is a plan view of a screen printing apparatus in the embodiment of the invention.
Figure 4:
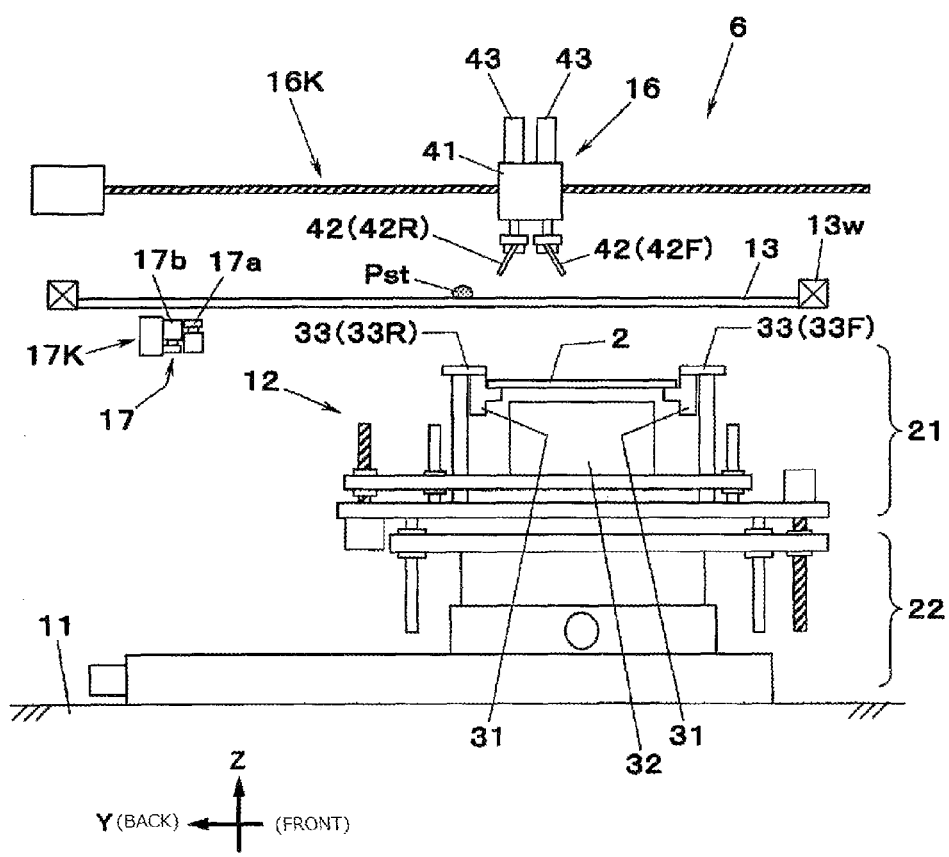
FIG. 4 is a side view of the screen printing apparatus in the embodiment of the invention.

The screen printing apparatus 6 performs screen printing selectively corresponding to each of the first substrate 2a supplied from the first substrate supply apparatus 4 and the second substrate 2b supplied from the second substrate supply apparatus 5. In FIGS. 3 and 4, the screen printing apparatus 6 includes a substrate holding movement mechanism 12 on a base 11, and a mask 13 is installed over the substrate holding movement mechanism 12. A position of the upstream process side of the substrate holding movement mechanism 12 on the base 11 is provided with a carry-in conveyor 14 for carrying in the substrate 2 supplied from another apparatus (the first substrate supply apparatus 4 or the second substrate supply apparatus 5) of the upstream process side and passing the substrate 2 to the substrate holding movement mechanism 12, and a position of the downstream process side of the substrate holding movement mechanism 12 on the base 11 is provided with a carry-out conveyor 15 for receiving the substrate 2 delivered by the substrate holding movement mechanism 12 and carrying out the substrate 2 to another apparatus (the component mounting apparatus 8) of the downstream process side. The upward side of the mask 13 is provided with a print head 16 movably in the Y-axis direction, and the downward side of the mask 13 is provided with a camera unit 17 movably in a direction in a horizontal plane.

In FIG. 4, the substrate holding movement mechanism 12 includes a substrate holding part 21, and a substrate holding part movement mechanism 22 for moving the substrate holding part 21 in the vertical direction and the direction in the horizontal plane. The substrate holding part 21 includes a pair of conveyance conveyors 31 (also see FIG. 3) for conveying the substrate 2 received from the carry-in conveyor 14 in the X-axis direction and positioning the substrate 2 in a predetermined clamp position, a lower receiving member 32 for supporting a lower surface of the substrate 2 positioned in the clamp position by the conveyance conveyors 31, and a pair of clampers 33 (also see FIG. 3) for clamping and holding the substrate 2 supported by the lower receiving member 32 from the Y-axis direction. In the embodiment, the clamper located in the side of the operator OP in the two clampers 33 is called a front clamper 33F, and the clamper located in the side opposite to the operator OP is called a back clamper 33R.

Figure 5:
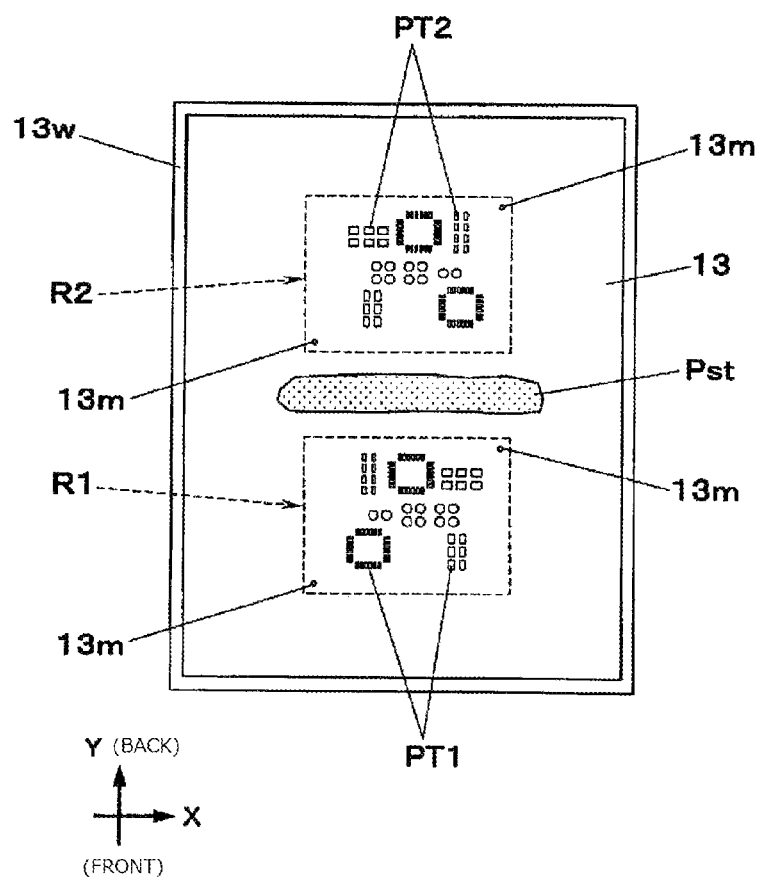
FIG. 5 is a plan view of a mask included by the screen printing apparatus in the embodiment of the invention.

In FIG. 5, the mask 13 has a rectangular flat plate shape extending in an XY plane, and the outer periphery of the mask is supported by a frame member 13w. In the mask 13, a region (a first pattern forming region R1) in which a first pattern PT1 corresponding to arrangement of electrodes 2D of the first substrate 2a is formed and a region (a second pattern forming region R2) in which a second pattern PT2 corresponding to arrangement of electrodes 2D of the second substrate 2b is formed are arranged in the Y-axis direction. In the embodiment, the first pattern forming region R1 is positioned in the front and the second pattern forming region R2 is positioned in the back (also see FIGS. 6A and 6B). The substrate holding part movement mechanism 22 can selectively position the substrate holding part 21 in any of a downward position (called a first position) of the first pattern forming region R1, a downward position (called a second position) of the second pattern forming region R2, and an intermediate position (called a standby position) between the first position and the second position.

In FIG. 3, the carry-in conveyor 14 is fixed to the upstream process side of a position between the first pattern forming region R1 and the second pattern forming region R2 of the mask 13, and receives the substrate 2 supplied from the first substrate supply apparatus 4 or the second substrate supply apparatus 5, and passes the substrate 2 to the conveyance conveyors 31 of the substrate holding part 21 positioned in the standby position. The carry-out conveyor 15 is fixed to the downstream process side of the position between the first pattern forming region R1 and the second pattern forming region R2 of the mask 13, and receives the substrate 2 from the conveyance conveyors 31 positioned in the standby position, and carries out the substrate 2 to the downstream process side.

In FIG. 3, respective diagonal positions of the top and bottom of the substrate 2 are provided with two substrate side marks 2m. Also, the first pattern forming region R1 and the second pattern forming region R2 on the mask 13 are respectively provided with two mask side marks 13m corresponding to the substrate side marks 2m (see FIG. 5).

After the substrate holding part movement mechanism 22 moves the substrate holding part 21 so that the substrate side marks 2m match with the mask side marks 13m in plan view, the substrate holding part movement mechanism 22 upwardly moves the substrate holding part 21 and brings the substrate 2 into contact with the mask 13. In the embodiment, the first substrate 2a is upwardly moved from the first position and is brought into contact with the first pattern forming region R1 of the mask 13 (FIG. 6A), and the second substrate 2b is upwardly moved from the second position and is brought into contact with the second pattern forming region R2 of the mask 13 (FIG. 6B). That is, in the embodiment, the substrate holding movement mechanism 12 is formed movably under the mask 13 in a predetermined direction (a direction of arrangement of the first pattern forming region and the second pattern forming region, that is, the Y-axis direction), and is configured to move the substrate 2 held by the substrate holding part 21 and selectively bring the substrate 2 into contact with one of the first pattern forming region R1 and the second pattern forming region R2.

Figure 6A:
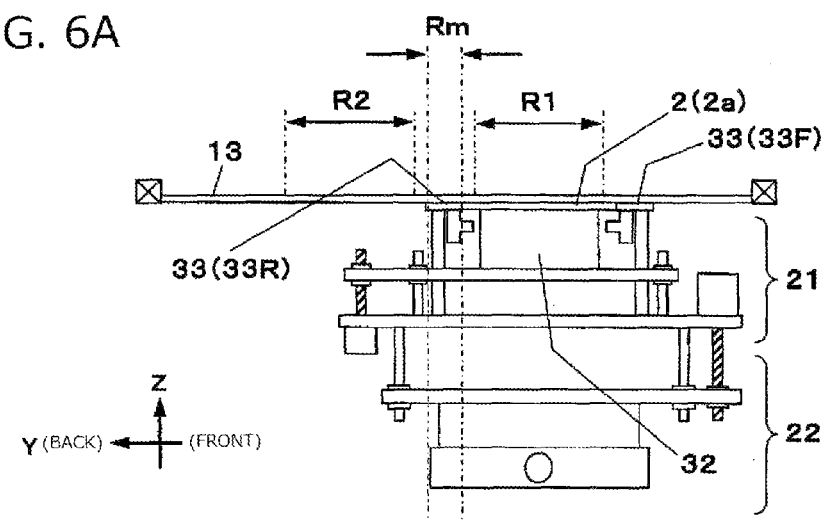
FIGS. 6A and 6B are partially side views of the screen printing apparatus in the embodiment of the invention.
Figure 6B:
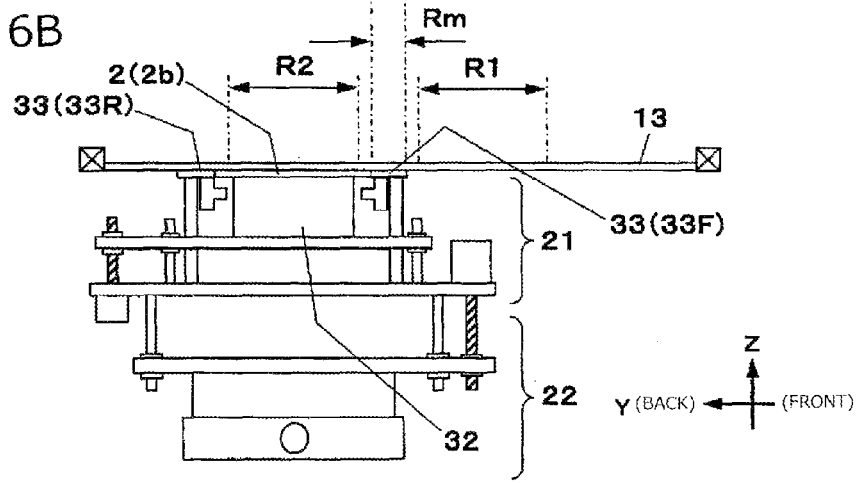

In the embodiment, a region of the mask 13 with which the back clamper 33R makes contact in the case of bringing the first substrate 2a into contact with the first pattern forming region R1 is equal to a region of the mask 13 with which the front clamper 33F makes contact in the case of bringing the second substrate 2b into contact with the second pattern forming region R2 (FIGS. 6A and 6B). The paste Pst is supplied to a region Rm between this first pattern forming region R1 and the second pattern forming region R2 (FIG. 5).

In FIGS. 3 and 4, the print head 16 includes a movement base 41 driven by a print head movement mechanism 16K and moved in the Y-axis direction, two squeegees 42 oppositely arranged in the Y-axis direction under the movement base 41, and two squeegee elevation cylinders 43 for upwardly and downwardly moving each of the squeegees 42 individually under the movement base 41. The squeegee located in the front (right side of paper of FIG. 4) in the two squeegees 42 arranged in the Y-axis direction is called a front squeegee 42F, and the squeegee located in the back (left side of paper of FIG. 4) is called a back squeegee 42R.

In FIGS. 3 and 4, the camera unit 17 includes an upward imaging camera 17a with an imaging visual field facing upwardly and a downward imaging camera 17b with an imaging visual field facing downwardly. The camera unit 17 is driven by a camera unit movement mechanism 17K and is moved in a horizontal plane.

Figure 7:
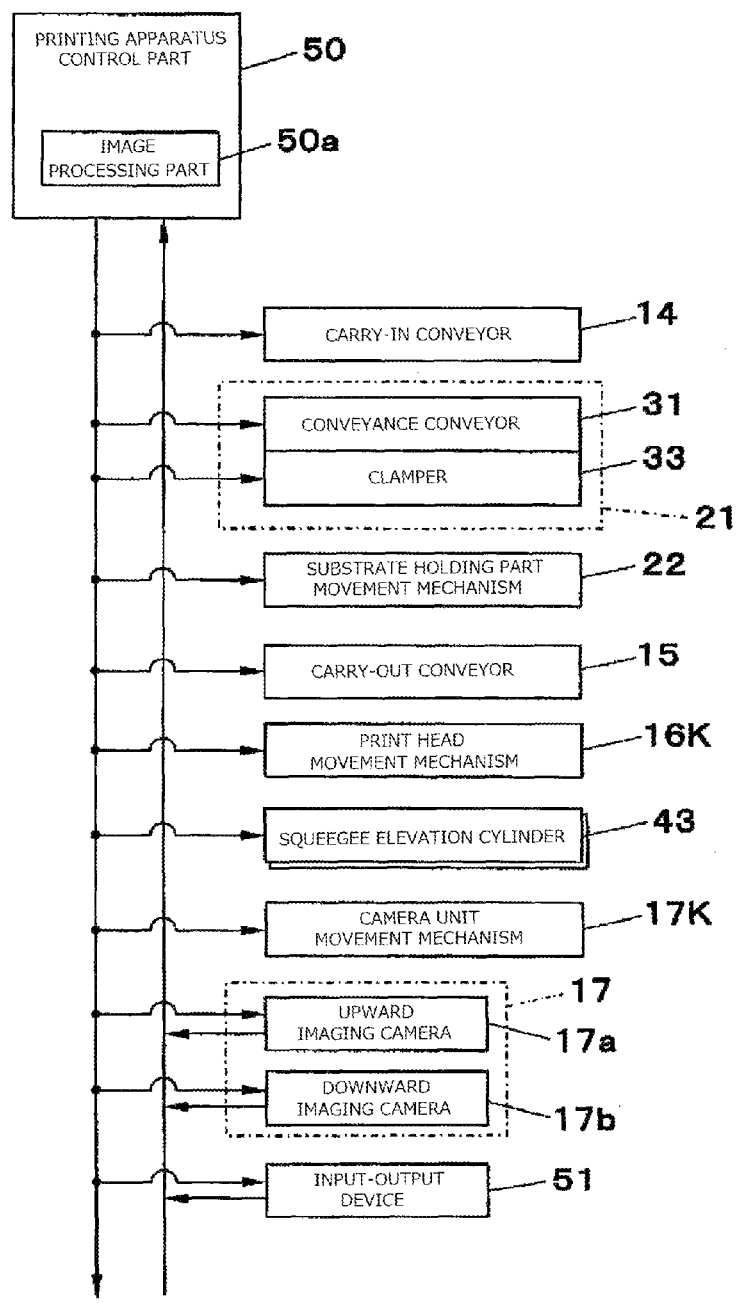
FIG. 7 is a block diagram showing a control system of the screen printing apparatus in the embodiment of the invention.

In FIG. 7, a printing apparatus control part 50 included by the screen printing apparatus 6 performs each control of carry-in operation of the substrate 2 by the carry-in conveyor 14, each control of operation of holding and conveyance of the substrate 2 by the substrate holding part 21, control of movement operation of the substrate holding part 21 by the substrate holding part movement mechanism 22, and each control of carry-out operation of the substrate by the carry-out conveyor 15. Also, the printing apparatus control part 50 performs each control of movement operation of the print head 16 in the Y-axis direction by the print head movement mechanism 16K, elevation operation of each of the squeegees 42 by the squeegee elevation cylinder 43, and movement operation of the camera unit 17 in the horizontal plane by the camera unit movement mechanism 17K.

In FIG. 7, the upward imaging camera 17a is controlled by the printing apparatus control part 50, and images the mask side marks 13m formed inside the first pattern forming region R1 of the mask 13 and the mask side marks 13m formed inside the second pattern forming region R2 of the mask 13. The downward imaging camera 17b is controlled by the printing apparatus control part 50, and images the substrate side marks 2m of the substrate 2 held by the substrate holding part 21. Image data obtained by imaging of the upward imaging camera 17a and image data obtained by imaging of the downward imaging camera 17b are inputted to the printing apparatus control part 50, and the printing apparatus control part 50 performs image processing of the image data in an image processing part 50a. Then, the printing apparatus control part 50 calculates a position of each of the mask side marks 13m and a position of each of the substrate side marks 2m based on images of the mask side marks 13m and images of the substrate side marks 2m obtained.

In FIG. 3, the front side (side of the operator OP) of the base 11 is provided with an input-output device 51 such as a touch panel. The input-output device 51 is connected to the printing apparatus control part 50 (FIG. 7), and the operator OP does a necessary input to the screen printing apparatus 6 through the input-output device 51 and acquires various information about the screen printing apparatus 6.

Figure 8A:
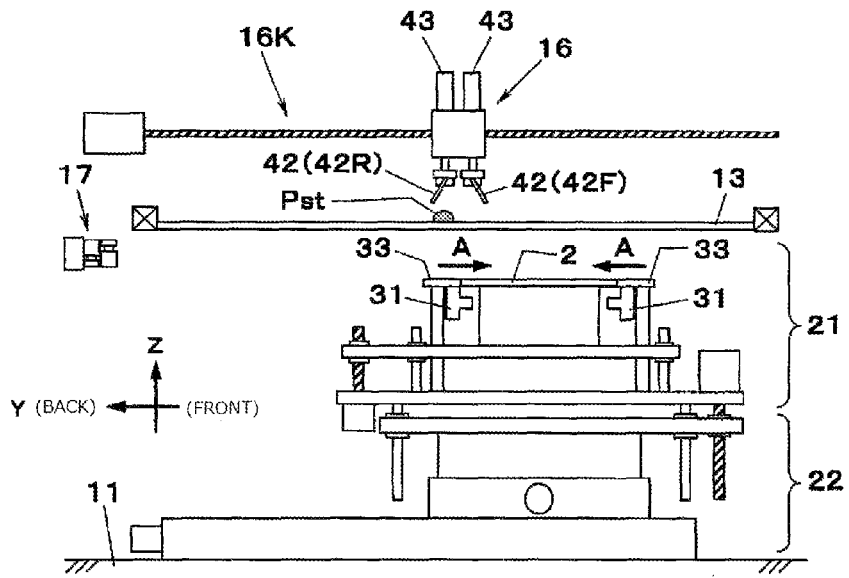
FIGS. 8A and 8B are operation explanatory diagrams of the screen printing apparatus in the embodiment of the invention.
Figure 8B:
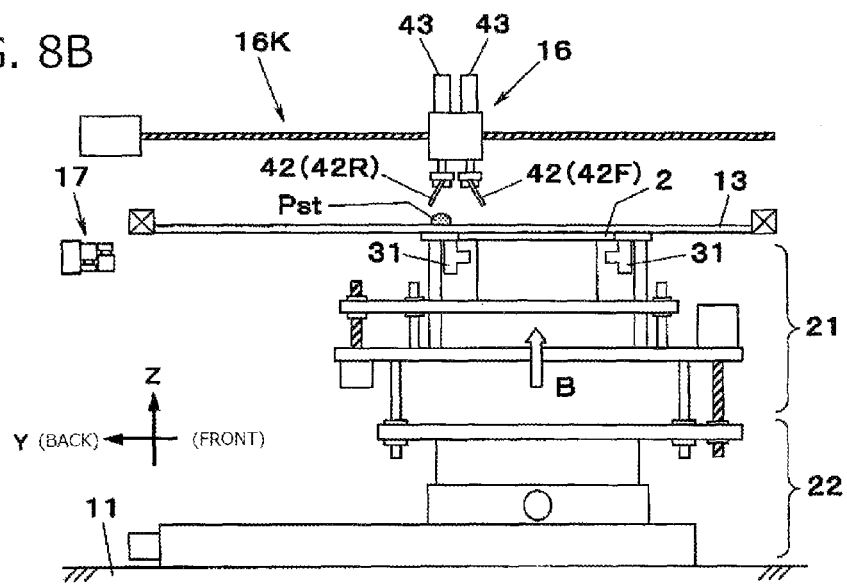
Figure 9A:
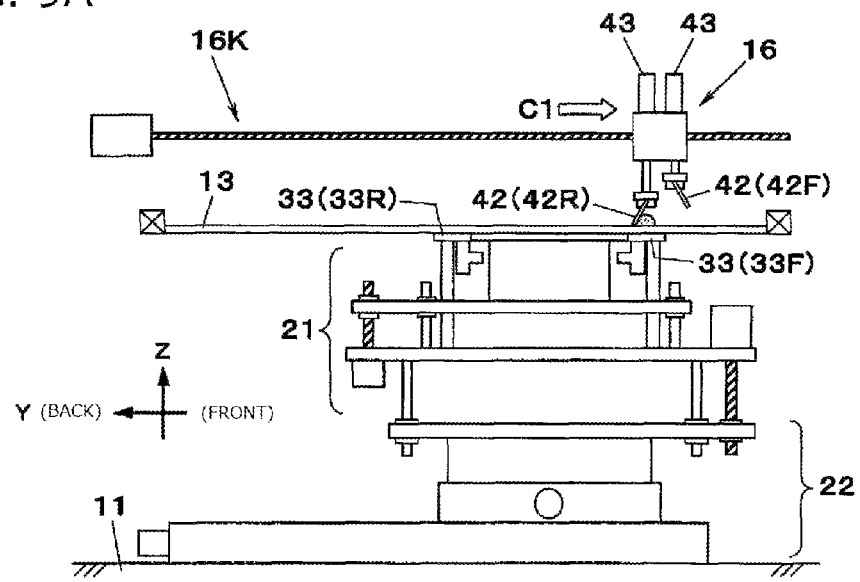
FIGS. 9A and 9B are operation explanatory diagrams of the screen printing apparatus in the embodiment of the invention.
Figure 9B:
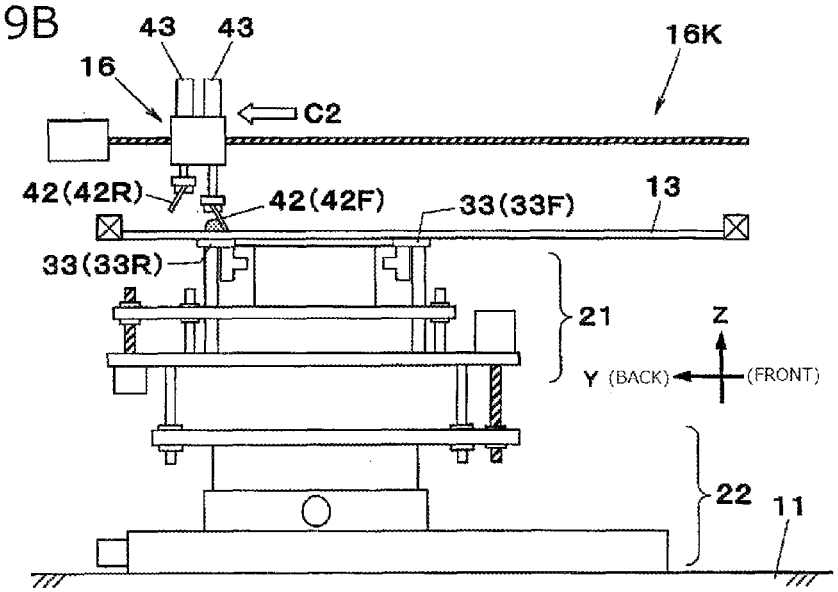

Next, a procedure of execution of screen printing work by the screen printing apparatus 6 will be described with reference to FIGS. 8 and 9. When a substrate 2 is delivered from the upstream process side in a state in which the substrate holding part movement mechanism 22 positions the substrate holding part 21 in the standby position described above, the carry-in conveyor 14 receives the substrate 2 and passes the substrate 2 to the conveyance conveyors 31 of the substrate holding part 21. The conveyance conveyors 31 convey the substrate 2, and position the substrate 2 in a clamp position. After the substrate 2 is positioned in the clamp position, the lower receiving member 32 supports a lower surface of the substrate 2, and a pair of clampers 33 clamps and holds the substrate 2 (arrow A shown in FIG. 8A).

After the clampers 33 hold the substrate 2, the camera unit 17 is moved under the mask 13, and the upward imaging camera 17a images the mask side marks 13m. In imaging of the mask side marks 13m, the mask side marks 13m of the inside of the first pattern forming region R1 are imaged when the first substrate 2a is brought into contact with the first pattern forming region R1 from now, and the mask side marks 13m of the inside of the second pattern forming region R2 are imaged when the second substrate 2b is brought into contact with the second pattern forming region R2 from now. After imaging of the camera unit 17 is completed, the downward imaging camera 17b images the substrate side marks 2m. After imaging of the downward imaging camera 17b is completed, the substrate holding part movement mechanism 22 moves the substrate holding part 21 holding the substrate 2 and performs alignment so that the substrate side marks 2m match with the mask side marks 13m in plan view and thereafter, upwardly moves the substrate holding part 21 and brings the substrate 2 into contact with the mask 13 (arrow B shown in FIG. 8B).

After the substrate 2 is brought into contact with the mask, the print head 16 downwardly moves one squeegee 42 and abuts the squeegee 42 on the mask 13 and moves the squeegee 42 in the Y-axis direction and thereby, paste Pst is scraped on the mask 13 and the inside of a pattern of the mask 13 is filled with the paste Pst. In the case of performing screen printing on the first substrate 2a brought into contact with the first pattern forming region R1, after the print head 16 is moved to the front so that the back squeegee 42R slides in the first pattern forming region R1 of the mask 13 (arrow C1 shown in FIG. 9A), the print head 16 is in turn moved to the back so that the front squeegee 42F slides in the first pattern forming region R1 of the mask 13. On the other hand, in the case of performing screen printing on the second substrate 2b brought into contact with the second pattern forming region R2, after the print head 16 is moved to the back so that the front squeegee 42F slides in the second pattern forming region R2 of the mask 13 (arrow C2 shown in FIG. 9B), the print head 16 is in turn moved to the front so that the back squeegee 42R slides in the second pattern forming region R2 of the mask 13.

In the screen printing apparatus 6 in the embodiment thus, the print head 16 prints the paste Pst on the substrate (the first substrate 2a or the second substrate 2b) brought into contact with the selected pattern forming region (the first pattern forming region R1 or the second pattern forming region R2).

After the inside of the pattern of the mask 13 is filled with the paste Pst, the substrate holding part movement mechanism 22 downwardly moves the substrate holding part 21, and separates the substrate 2 from the mask 13 (snap-off). Accordingly, after the screen printing work per sheet of the substrate 2 is completed, the clampers 33 are opened to release holding of the substrate 2, and the conveyance conveyors 31 and the carry-out conveyor 15 are interlocked and actuated to carry out the substrate 2 to the downstream process side.

Figure 10:
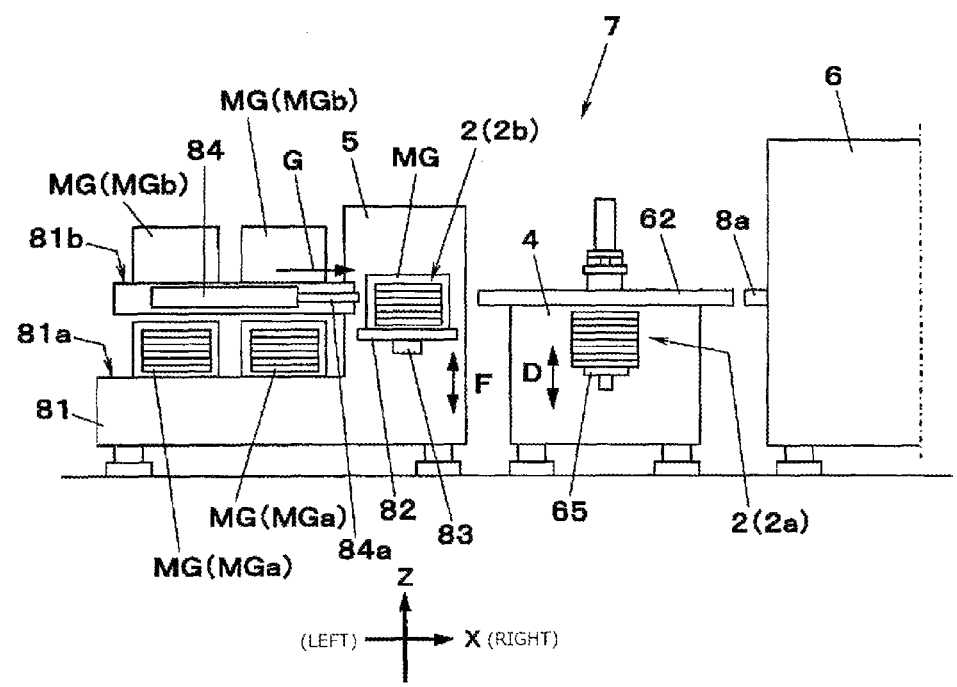
FIG. 10 is a configuration diagram of the screen printing system in the embodiment of the invention.

Next, operation and configurations of the first substrate supply apparatus 4 and the second substrate supply apparatus 5 for supplying the substrate 2 to the screen printing apparatus 6 will be described using FIGS. 10 to 15. In FIG. 10, the first substrate supply apparatus 4 delivers the first substrate 2a stocked in a directly stacked state to the downstream process side (that is, to the screen printing apparatus 6) in the case of receiving a signal (a first substrate request signal) for requesting supply of the first substrate 2a from the screen printing apparatus 6. The second substrate supply apparatus 5 delivers the second substrate 2b stocked in a stepwise stacked state in a magazine MG to the downstream process side (that is, to the first substrate supply apparatus 4) in the case of receiving a signal (a second substrate request signal) for requesting supply of the second substrate 2b from the screen printing apparatus 6.

Figure 11A:
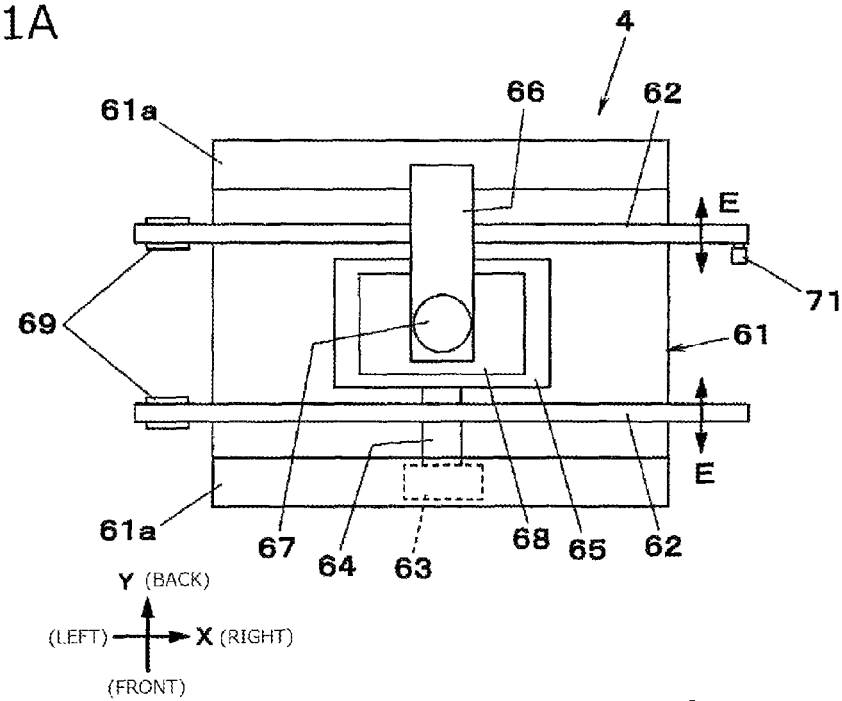
FIG. 11A is a plan view of a first substrate supply apparatus constructing the screen printing system in the embodiment of the invention.
Figure 11B:
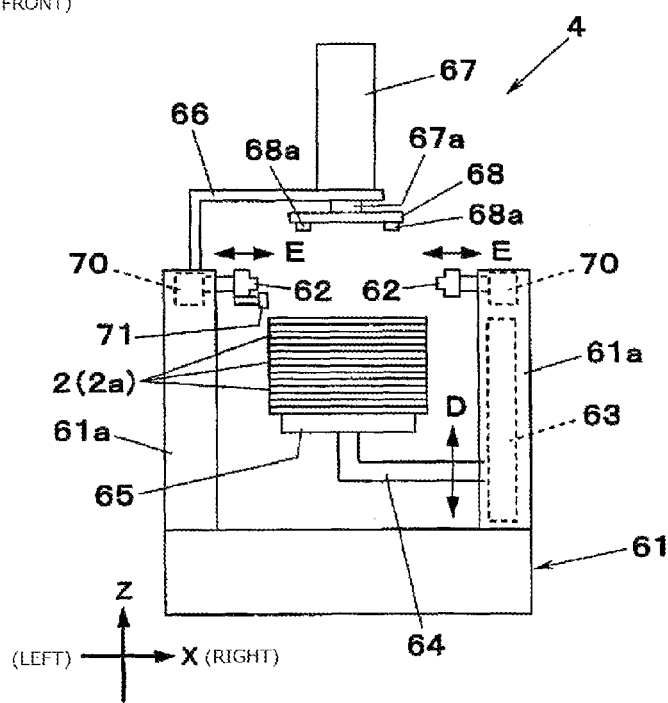
FIG. 11B is a side view of the first substrate supply apparatus.

In FIGS. 10, 11A and 11B, the first substrate supply apparatus 4 includes a base 61 having front and back sidewall parts 61a, and a pair of substrate supply conveyors 62 (a conveyance mechanism) formed between the front and back sidewall parts 61a so as to extend in the X-axis direction. A support member 64 upwardly and downwardly moved (arrow D shown in FIGS. 10 and 11B) by an elevation mechanism 63 formed in the sidewall part 61a is arranged in space between the front and back sidewall parts 61a, and the upper end of the support member 64 is provided with a substrate placement part 65 on which the first substrates 2a directly stacked are placed.

One sidewall part 61a is provided with a bracket 66 overhanging in an upward position of the substrate placement part 65, and this bracket 66 is provided with a cylinder 67 in a posture in which a piston rod 67a faces downwardly. A substrate takeout part 68 including plural suction pads 68a on a lower surface is attached to the lower end of the piston rod 67a. The substrate supply conveyors 62 are driven by conveyor driving parts 69, and conveyor width adjusting parts 70 formed in the sidewall parts 61a move each of the substrate supply conveyors 62 in the Y-axis direction (arrow E shown in FIGS. 11A and 11B) and thereby, a distance (a conveyor width) between a pair of substrate supply conveyors 62 can be changed. The end of the carry-out side (side of the screen printing apparatus 6) of the substrate 2 of one substrate supply conveyor is provided with a substrate detecting sensor 71 for detecting the substrate 2 conveyed by the substrate supply conveyors 62 and outputting a substrate detection signal.

The elevation mechanism 63 upwardly and downwardly moves the support member 64 to thereby position the highest substrate of the first substrates 2a in a directly stacked state placed on the substrate placement part 65 at a constant height always. The substrate takeout part 68 is upwardly and downwardly moved by the cylinder 67, and is upwardly moved with the first highest substrate 2a of the substrates 2 placed on the substrate placement part 65 sucked by the suction pads 68a, and places the substrate on a pair of substrate supply conveyors 62 from the upward side. The conveyor width adjusting parts 70 are constructed so as to support both ends of the substrate 2 in the Y-axis direction by a pair of substrate supply conveyors 62 by adjusting the conveyor width wider than a width of the substrate 2 when the substrate 2 taken out by the substrate takeout part 68 is upwardly moved from the downward side between a pair of substrate supply conveyors 62 and adjusting the conveyor width somewhat wider than the width of the substrate 2 when the substrate 2 is placed. After the substrate 2 is placed on the substrate supply conveyors 62 in this manner, the conveyor driving parts 69 drive the substrate supply conveyors 62, and deliver the substrate 2 to the screen printing apparatus 6.

Figure 12:
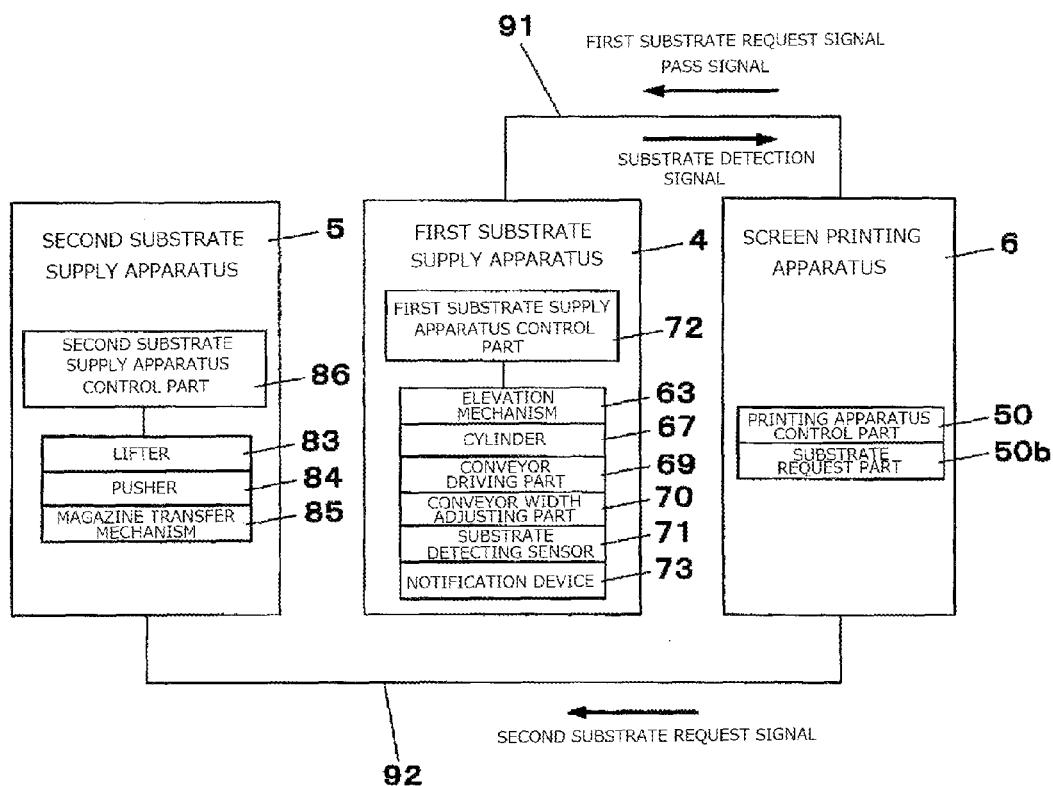
FIG. 12 is a block diagram showing a signal transmission system of the screen printing system in the embodiment of the invention.

In FIG. 12, a first substrate supply apparatus control part 72 included by the first substrate supply apparatus 4 performs actuation control of the elevation mechanism 63, the cylinder 67, the conveyor driving parts 69 and the conveyor width adjusting parts 70 described above. A notification device 73 such as a lamp is connected to the first substrate supply apparatus control part 72, and a substrate detection signal outputted by the substrate detecting sensor 71 is inputted to the first substrate supply apparatus control part 72.

In FIG. 10, the second substrate supply apparatus 5 includes a placement table 82 in which the magazine MG described above is placed on a base part 81, a lifter 83 for upwardly and downwardly moving the placement table 82, and a pusher 84 for projecting and actuating a pressing part 84a to the downstream process side (side of the first substrate supply apparatus 4). The magazine MG (a magazine MGa before use) in which the second substrates 2b before supply are housed can be placed on a magazine placement part 81a before use of the base part 81, and the empty magazine MG (a magazine MGb after use) after supplying the substrate 2 can be placed on a magazine placement part 81b after use of the base part 81. A magazine transfer mechanism 85 shown in FIG. 12 transfers the magazine MGa before use from the magazine placement part 81a before use to the lifter 83, and transfers the magazine MGb after use from the lifter 83 to the magazine placement part 81b after use.

In the second substrate supply apparatus 5, when the pressing part 84a of the pusher 84 is projected to the downstream process side (arrow G shown in FIG. 10) in a state in which the second substrate 2b in the highest step inside the magazine MG is positioned at the height of the substrate supply conveyors 62 of the first substrate supply apparatus 4 by upwardly and downwardly moving the placement table 82 on which the magazine MG is placed by the lifter 83 (arrow F shown in FIG. 10), the second substrate 2b in the highest step inside the magazine MG is delivered to the substrate supply conveyors 62 of the first substrate supply apparatus 4. As shown in FIG. 12, a second substrate supply apparatus control part 86 included by the second substrate supply apparatus 5 performs each control of the lifter 83, the pusher 84 and the magazine transfer mechanism 85.

In FIG. 12, the screen printing apparatus 6 is connected to the first substrate supply apparatus 4 by a first signal transmission line 91, and the screen printing apparatus 6 is connected to the second substrate supply apparatus 5 by a second signal transmission line 92.

Figure 13:
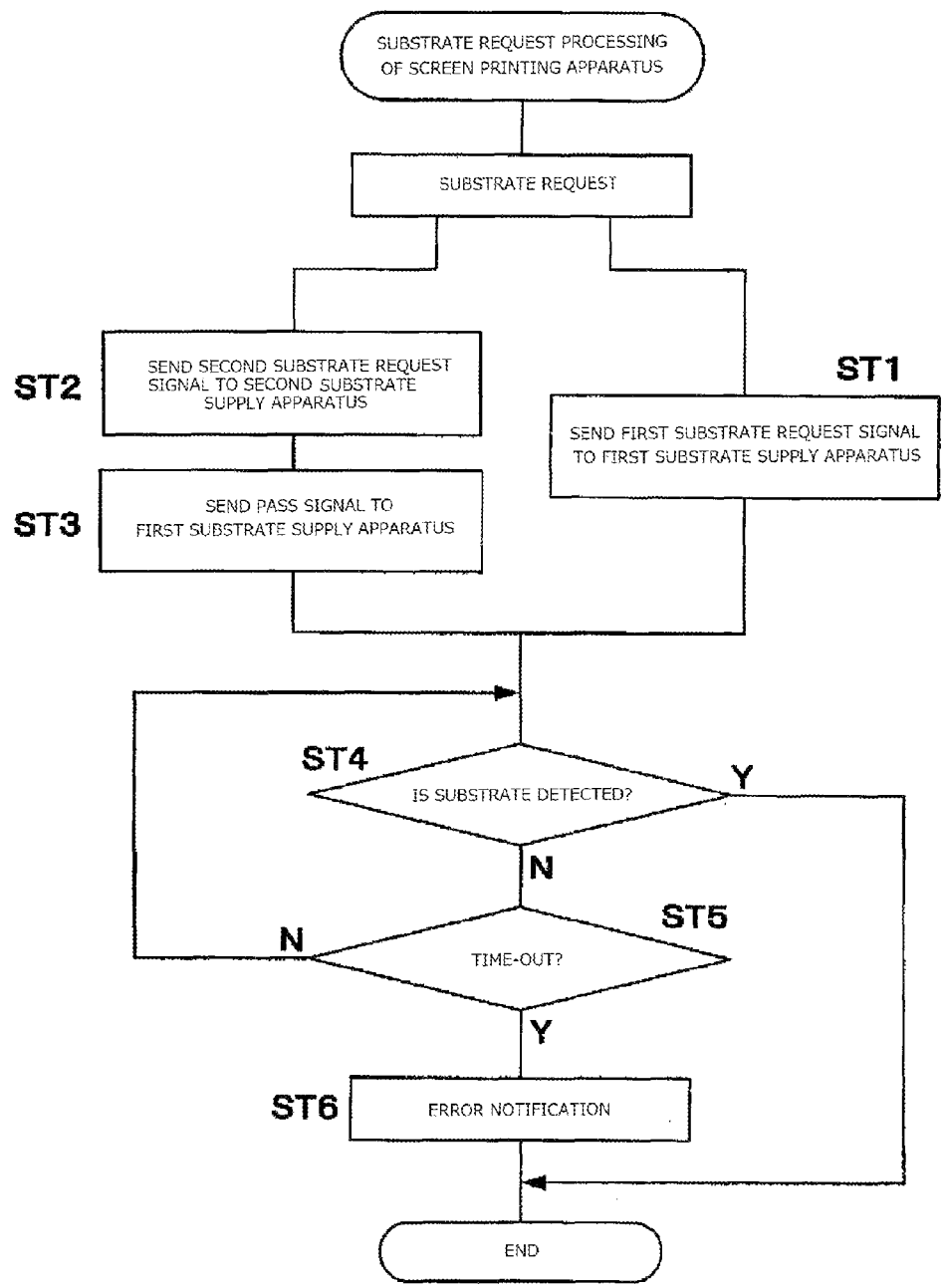
FIG. 13 is a flow diagram showing a flow of substrate request processing of the screen printing apparatus constructing the screen printing system in the embodiment of the invention.
Figure 14:
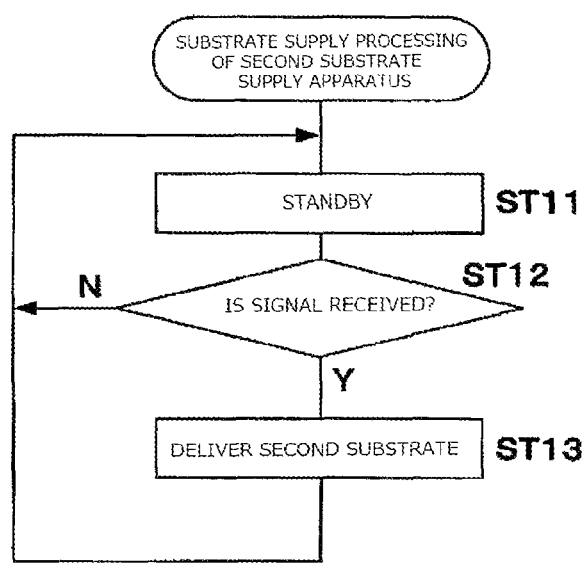
FIG. 14 is a flow diagram showing a flow of substrate supply processing of a second substrate supply apparatus constructing the screen printing system in the embodiment of the invention.
Figure 15:
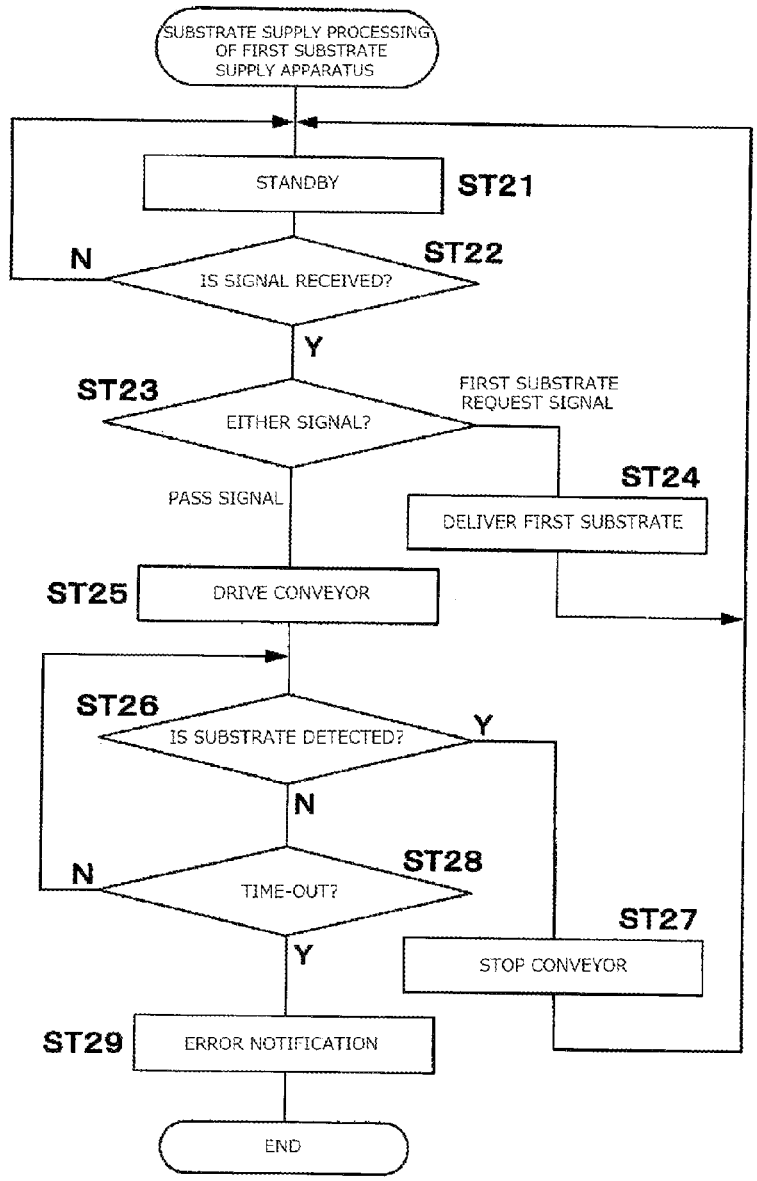
FIG. 15 is a flow diagram showing a flow of substrate supply processing of the first substrate supply apparatus constructing the screen printing system in the embodiment of the invention.

In the case of requesting supply of the first substrate 2a from the first substrate supply apparatus 4, the screen printing apparatus 6 sends a first substrate request signal from a substrate request part 50b of the printing apparatus control part 50 to the first substrate supply apparatus control part 72 through the first signal transmission line 91 (step ST1 of FIG. 13). On the other hand, in the case of requesting supply of the second substrate 2b from the second substrate supply apparatus 5, the screen printing apparatus 6 sends a second substrate request signal from the substrate request part 50b to the second substrate supply apparatus control part 86 through the second signal transmission line 92 (step ST2 of FIG. 13) and also sends a pass signal from the substrate request part 50b to the first substrate supply apparatus control part 72 through the first signal transmission line 91 (step ST3 of FIG. 13). Here, the pass signal refers to a signal for commanding the first substrate supply apparatus 4 to perform operation in which the first substrate supply apparatus 4 receives the second substrate 2b, delivered to the downstream process side by the second substrate supply apparatus 5, by the substrate supply conveyors 62 and conveys and passes this second substrate 2b to the screen printing apparatus 6 (that is, the second substrate 2b is passed to the screen printing apparatus 6).

The second substrate supply apparatus 5 decides whether or not the second substrate request signal is received from the screen printing apparatus 6 in a standby state (step ST11 of FIG. 14) (step ST12), and in the case of deciding that the second substrate request signal is received from the screen printing apparatus 6, the second substrate 2b is delivered to the first substrate supply apparatus 4 (step ST13).

The first substrate supply apparatus 4 decides whether or not a signal (the first substrate request signal or the pass signal) is received from the screen printing apparatus 6 in a standby state (step ST21 of FIG. 15) (step ST22), and in the case of deciding that the signal is received from the screen printing apparatus 6, it is decided whether the received signal is the first substrate request signal or the pass signal (step ST23). Then, when the received signal is the first substrate request signal, the first substrate supply apparatus 4 delivers the first substrate 2a to the screen printing apparatus 6 (step ST24), and when the received signal is the pass signal, the first substrate supply apparatus 4 drives the substrate supply conveyors 62 (step ST25), and conveys (passes) the second substrate 2b received from the second substrate supply apparatus 5 and passes the second substrate 2b to the screen printing apparatus 6.

The first substrate supply apparatus 4 decides whether or not the substrate detecting sensor 71 detects the substrate (the second substrate 2b) after driving of the substrate supply conveyors 62 is started in step ST25 (step ST26). Then, when the substrate detecting sensor 71 detects the substrate 2, the substrate supply conveyors 62 are stopped after a lapse of predetermined time (time taken to complete a pass of the substrate 2 to the carry-in conveyor 14 of the screen printing apparatus 6) (step ST27). On the other hand, when the substrate detecting sensor 71 does not detect the substrate 2, it is decided whether or not time elapsed since driving of the substrate supply conveyors 62 was started reaches predetermined time (a time-out occurs) (step ST28). Then, when the time-out does not occur, the decision of step ST26 is repeated, and when the time-out occurs, the processing of supply of the substrate 2 is ended after predetermined error notification is provided through the notification device 73 described above (step ST29).

The screen printing apparatus 6 sends the second substrate request signal to the second substrate supply apparatus 5 (step ST2), and together sends the pass signal to the first substrate supply apparatus 4 (step ST3). Thereafter, the screen printing apparatus 6 whether or not the substrate 2 is carried in the carry-in conveyor 14, that is, a carry-in detecting sensor (not shown) detects the substrate 2 (step ST4 of FIG. 13). Then, when the carry-in detecting sensor detects the substrate 2, substrate request processing is ended, and when the carry-in detecting sensor does not detect the substrate 2, it is decided whether or not time elapsed since the pass signal was sent to the first substrate supply apparatus 4 reaches predetermined time (a time-out occurs) (step ST5), and when the time-out does not occur, the decision of step ST4 is repeated, and when the time-out occurs, the substrate request processing is ended after predetermined error notification is provided through the input-output device 51 (step ST6).

In this manner, the first substrate 2a and the second substrate 2b are supplied to the screen printing apparatus 6. After the screen printing apparatus 6 passes the supplied first substrate 2a or the second substrate 2b to the substrate holding movement mechanism 12, the screen printing apparatus 6 selectively performs screen printing on the first substrate 2a or the second substrate 2b and then carries out the substrate to the component mounting apparatus 8 of the downstream process side.

In FIGS. 1 and 2, the component mounting apparatus 8 includes one substrate conveyance lane 8a for conveying the substrate 2, and a work device 8b for performing component mounting work on the substrate 2 carried in by the substrate conveyance lane 8a. The component mounting apparatus 8 conveys and positions the substrate 2 received from the screen printing apparatus 6 by the substrate conveyance lane 8a, and performs predetermined component mounting related work by the work device 8b. Here, when the work is inspection work of the substrate 2 on which the paste Pst is printed by the screen printing apparatus 6, the work device 8b is an inspection head, and when the work is component mounting work of attaching the electronic component 3 to the substrate 2, the work device 8b is a mounting head. After the predetermined component mounting related work by the work device 8b is completed, each component mounting apparatus 8 actuates the substrate conveyance lane 8a and carries out the substrate 2 to the downstream process side. In this manner, the mounting substrate (double-sided substrate) is manufactured by the component mounting line 1 in the embodiment.

As described above, in the component mounting line 1 in the embodiment, the first substrate 2a delivered by the first substrate supply apparatus 4 is directly passed to the screen printing apparatus 6, and the second substrate 2b delivered by the second substrate supply apparatus 5 is passed to the screen printing apparatus 6 by a relay to the substrate supply conveyors 62 which are the conveyance mechanism of the first substrate supply apparatus 4, with the result that the screen printing apparatus 6 can be supplied of plural kinds of substrates 2 in parallel from the two substrate supply apparatuses (the first substrate supply apparatus 4 and the second substrate supply apparatus 5) arranged in series. That is, according to the component mounting line 1 (the screen printing apparatus 6, the screen printing system 7) in the embodiment, it is unnecessary to, as in the related art, parallelly arrange plural substrate supply apparatuses in the direction (Y-axis direction herein) orthogonal to the conveyance direction of the substrate 2 in order to supply plural kinds of substrates 2 to the screen printing apparatus 6 in parallel. As a result, screen printing can be performed on plural kinds of substrates 2 in parallel without upsizing the screen printing apparatus.

In addition, in the embodiment described above, the first substrate 2a is the substrate 2 in which the paste Pst such as solder is not printed on both of the top and bottom surfaces and one surface of the substrate faces upwardly, and the second substrate 2b is the substrate in which the other surface where the paste Pst printing and the like are not yet performed in the first substrate 2a faces upwardly, but this is one example, and the first substrate 2a and the second substrate 2b can also adopt completely different kinds of substrates 2. Also, in the embodiment described above, the first substrate supply apparatus is the type of apparatus for supplying the substrate 2 from the directly stacked state, and the second substrate supply apparatus is the type of apparatus for supplying the substrate 2 from the stepwise stacked state, but this is only one example.

A screen printing system, a screen printing apparatus and a component mounting line capable of performing screen printing on plural kinds of substrates in parallel without upsizing the screen printing apparatus are provided.

What is claimed is:

1. A screen printing system comprising:
  a first substrate supply apparatus that supplies a first substrate and includes a conveyance mechanism;
  a second substrate supply apparatus that is arranged in an upstream process side of the first substrate supply apparatus and supplies a second substrate; and
  a screen printing apparatus that prints paste on the first substrate supplied from the first substrate supply apparatus and the second substrate supplied from the second substrate supply apparatus, wherein
  the screen printing apparatus comprises:
  a mask in which a first pattern forming region in which a first pattern corresponding to the first substrate is formed and a second pattern forming region in which a second pattern corresponding to the second substrate is formed are arranged in a predetermined direction;
  a substrate holding part that holds a substrate of the first substrate or the second substrate;
  a substrate holding movement mechanism that is formed movably under the mask in the predetermined direction, moves the substrate held by the substrate holding part, and selectively brings the substrate into contact with one of the first pattern forming region and the second pattern forming region;
  a print head that prints paste on the substrate brought into contact with the selected pattern forming region;
  a substrate request part that requests supply of the first substrate from the first substrate supply apparatus and requests supply of the second substrate from the second substrate supply apparatus, wherein
  the first substrate supply part supplies the first substrate in response to the request from the substrate request part and the second substrate supply part supplies the second substrate in response to the request from the substrate request part, and
  the second substrate supplied by the second substrate supply apparatus is carried in the screen printing apparatus by the conveyance mechanism included in the first substrate supply apparatus,
  wherein the first substrate supply apparatus comprises a single pair of conveyor rails, and the single pair of conveyor rails is located on the first substrate supply apparatus between the second substrate supply apparatus and the screen printing apparatus, and wherein both the first substrate and the second substrate are transferred on the single pair of conveyor rails to the conveyance mechanism,
  wherein the screen printing apparatus is connected to the first substrate supply apparatus by a first signal transmission line, and is connected to the second substrate supply apparatus by a second signal transmission line, and
  the substrate request part sends a substrate request signal to the second substrate supply apparatus via the second transmission line and also sends a pass signal to the first substrate supply apparatus via the first single transmission line, the pass signal commanding the first substrate supply apparatus to drive the conveyance mechanism to convey the second substrate supplied by the second substrate supply apparatus, when the substrate request part requests the supply of the second substrate from the second substrate supply apparatus.

2. A component mounting line comprising:
the screen printing system according to claim 1; and
a component mounting apparatus that mounts a component on the screen-printed substrate carried out by the screen printing apparatus.

3. A screen printing apparatus that prints paste on a first substrate supplied from a first substrate supply apparatus that includes a conveyance mechanism and a second substrate supplied from a second substrate supply apparatus arranged in an upstream process side of the first substrate supply apparatus, the screen printing apparatus comprising:
a mask in which a first pattern forming region in which a first pattern corresponding to the first substrate is formed and a second pattern forming region in which a second pattern corresponding to the second substrate is formed are arranged in a predetermined direction;
a substrate holding part that holds a substrate of the first substrate or the second substrate;
a substrate holding movement mechanism that is formed movably under the mask in the predetermined direction, moves the substrate held by the substrate holding part, and selectively brings the substrate into contact with one of the first pattern forming region and the second pattern forming region;
a print head that prints paste on the substrate brought into contact with the selected pattern forming region;
a substrate request part that requests supply of the first substrate from the first substrate supply apparatus and requests supply of the second substrate from the second substrate supply apparatus, wherein
the substrate request part sends a substrate request signal to the second substrate supply apparatus and also sends a pass signal to the first substrate supply apparatus, the pass signal commanding the first substrate supply apparatus to drive the conveyance mechanism included by the first substrate supply apparatus to convey the second substrate supplied by the second substrate supply apparatus,
wherein the first substrate supply apparatus comprises a single pair of conveyor rails, and the single pair of conveyor rails is located on the first substrate supply apparatus between the second substrate supply apparatus and the screen printing apparatus, and wherein both the first substrate and the second substrate are transferred on the single pair of conveyor rails to the conveyance mechanism,
wherein the screen printing apparatus is connected to the first substrate supply apparatus by a first signal transmission line, and is connected to the second substrate supply apparatus by a second signal transmission line, and
the substrate request part sends a substrate request signal to the second substrate supply apparatus via the second transmission line and also sends a pass signal to the first substrate supply apparatus via the first single transmission line, the pass signal commanding the first substrate supply apparatus to drive the conveyance mechanism to convey the second substrate supplied by the second substrate supply apparatus, when the substrate request part requests the supply of the second substrate from the second substrate supply apparatus.

\* \* \* \* \*